US007978115B2

(12) United States Patent
Veeder et al.

(10) Patent No.: US 7,978,115 B2
(45) Date of Patent: Jul. 12, 2011

(54) SYSTEM AND METHOD FOR ANALOG-TO-DIGITAL CONVERSION

(75) Inventors: Kenton T. Veeder, Winthrop, MA (US); Micky Randall Harris, Lompoc, CA (US); Leonard P. Chen, Santa Barbara, CA (US)

(73) Assignee: Raytheon Company, Waltham, MA (US)

( * ) Notice: Subject to any disclaimer, the term of this patent is extended or adjusted under 35 U.S.C. 154(b) by 56 days.

(21) Appl. No.: 12/497,923

(22) Filed: Jul. 6, 2009

(65) Prior Publication Data
US 2011/0001647 A1   Jan. 6, 2011

(51) Int. Cl.
*H03M 1/38* (2006.01)
(52) U.S. Cl. .................. 341/161; 341/155
(58) Field of Classification Search .......... 341/144, 341/155, 161, 162
See application file for complete search history.

(56) References Cited

U.S. PATENT DOCUMENTS

| 3,737,897 | A | | 6/1973 | Cuthbert et al. | 340/347 |
| 4,998,109 | A | | 3/1991 | LeChevalier | 341/166 |
| 5,298,902 | A | | 3/1994 | Kogan | 341/157 |
| 5,321,404 | A | | 6/1994 | Mallinson et al. | 341/169 |
| 5,635,937 | A | * | 6/1997 | Lim et al. | 341/161 |
| 5,880,691 | A | * | 3/1999 | Fossum et al. | 341/162 |
| 6,177,901 | B1 | | 1/2001 | Pan et al. | 341/166 |
| 6,489,904 | B1 | * | 12/2002 | Hisano | 341/120 |
| 2004/0070917 | A1 | * | 4/2004 | Michalski | 361/256 |
| 2008/0218265 | A1 | * | 9/2008 | Murden et al. | 330/253 |

OTHER PUBLICATIONS

Kleinfelder et al.; "A 10,000 Frames/s CMOS Digital Pixel Sensor"; IEEE Journal of Solid-State Circuits, vol. 36, No. 12; pp. 2049-2059, Dec. 2001.
Milgrome et al.; "A 12 Bit Analog to Digital Converter for VLSI Applications in nuclear Science"; IEEE Transactions on Nuclear Science, vol. 39, No. 4; pp. 771-775, 1992.
Eric R. Fossum; "CMOS Image Sensors: Electronic Camera On A Chip"; IEDM; pp. 17-25, 1995.
Pain et al.; "A Single-Chip Programmable Digital CMOS Imager with Enhanced Low-Light Detection Capability"; 13th Int. Conf. VLSI Design; pp. 342-347, 2000.

* cited by examiner

*Primary Examiner* — Jean B Jeanglaude
(74) *Attorney, Agent, or Firm* — Baker Botts L.L.P.

(57) ABSTRACT

A system for converting an analog signal to a digital signal may include a plurality of converter stages. One of the converter stages may include a multiplying digital-to-analog converter (MDAC) and an analog-to-digital subconverter (ADSC). The MDAC may be configured to (i) receive from a previous stage a first residue analog signal and a first idealized digital signal representing a first portion of the digital signal and corresponding to the first residue analog signal; (ii) convert the first idealized digital signal to an idealized analog signal; and (iii) output a second residue analog signal based on the difference between the first residue analog signal and the idealized analog signal. The ADSC may be configured to convert the second residue analog signal into a second idealized digital signal representing a second portion of the digital signal and corresponding to the second residue analog signal, the ADSC comprising a sloping analog-to-digital converter.

21 Claims, 1 Drawing Sheet

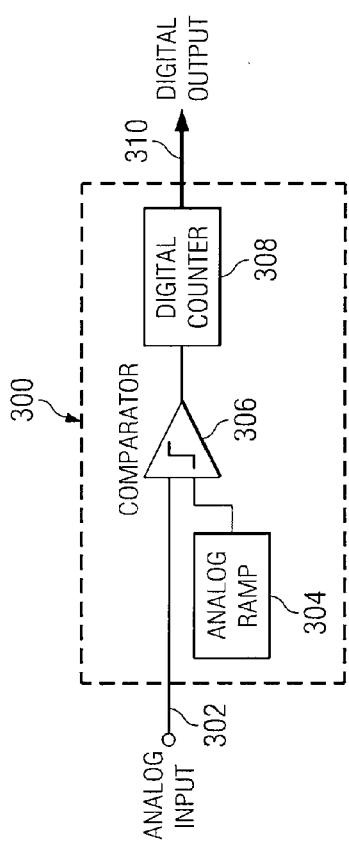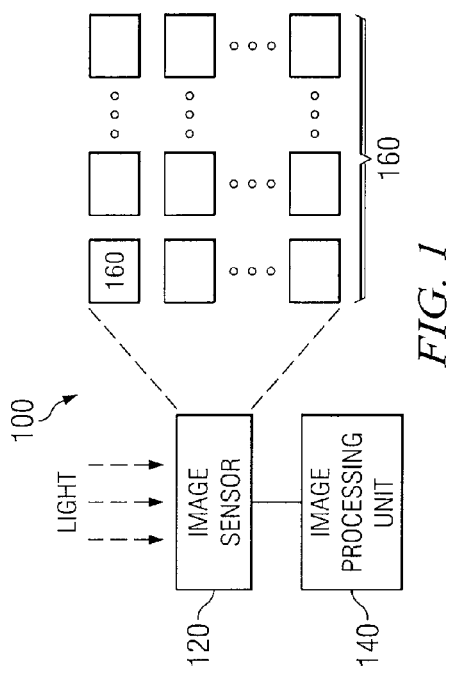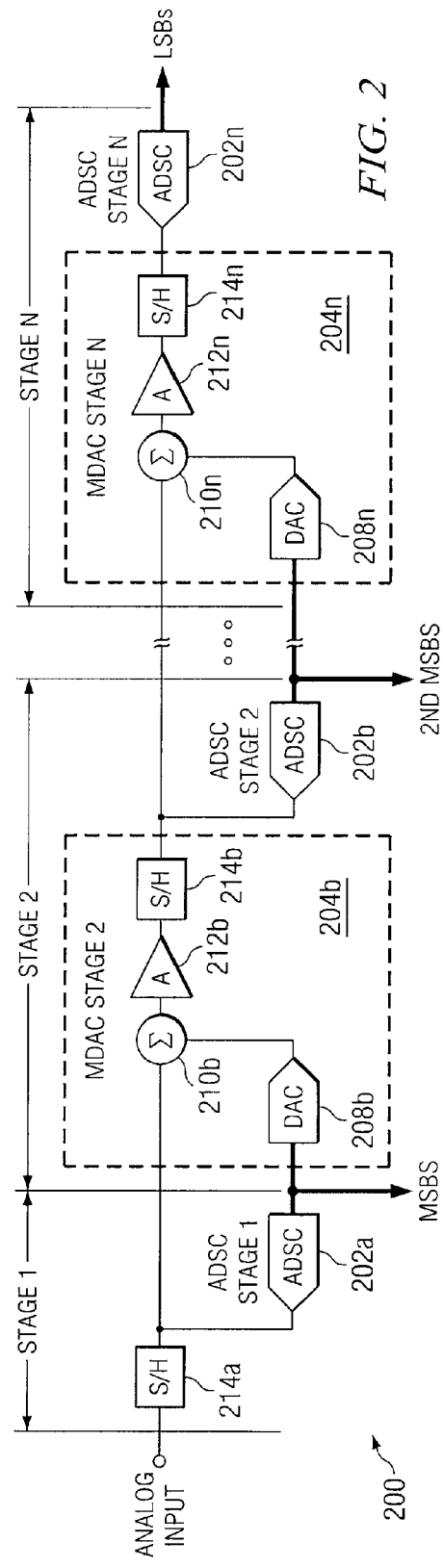

SYSTEM AND METHOD FOR ANALOG-TO-DIGITAL CONVERSION

GOVERNMENT LICENSE RIGHTS

This invention was made with Government support via Contract number 03-C-4009 (Victory Program). The Government has certain rights in this invention.

TECHNICAL FIELD

This disclosure relates in general to conversion of analog signals to digital signals and more particularly to an analog-to-digital conversion system and method utilizing a pipelined single-slope analog-to-digital converter.

BACKGROUND

Many devices, including image sensing circuits, often require many channels of image data to be converted from analog signals to digital signals via analog-to-digital conversion. Such analog-to-digital converters (ADCs) may be located on an integrated circuit (IC) external to image sensing circuit, or such ADCs may be integrated on the same integrated circuit as the image sensing circuitry. Integration of ADCs on the same integrated circuit as the image sensing circuitry is often utilized as the number of channels (e.g. pixels) increase due to interconnect noise and transmission line loss associated with communicating signals to external ADC circuits. However, approaches employing traditional ADCs integrated on the same integrated circuit as imaging sensing circuitry often consume large amounts of power and area for large resolutions.

SUMMARY OF THE DISCLOSURE

According to one embodiment, a system for converting an analog signal to a digital signal may include a plurality of converter stages. One or more of the converter stages may include a multiplying digital-to-analog converter and an analog-to-digital subconverter. The multiplying digital-to-analog converter may be configured to (i) receive from a previous stage a first residue analog signal and a first idealized digital signal representing a first portion of the digital signal and corresponding to the first residue analog signal; (ii) convert the first idealized digital signal to an idealized analog signal; and (iii) output a second residue analog signal based on the difference between the first residue analog signal and the idealized analog signal. The analog-to-digital subconverter may be configured to convert the second residue analog signal into a second idealized digital signal representing a second portion of the digital signal and corresponding to the second residue analog signal, the analog-to-digital subconverter comprising a sloping analog-to-digital converter.

Technical advantages of certain embodiments may including providing an analog-to-digital converter with low power and low space requirements, while also maintaining adequate conversion speed.

Other technical advantages will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present disclosure and its advantages, reference is now made to the following description, taken in conjunction with the accompanying drawings, in which:

FIG. 1 depicts a block diagram illustrating an example image sensing device that may be used to capture images, in accordance with certain embodiments of the present disclosure;

FIG. 2 depicts a block diagram illustrating an example pipelined analog-to-digital converter that may be used to convert analog signals into digital signals, in accordance with certain embodiments of the present disclosure; and FIG. 3 depicts a block diagram illustrating an example sloping analog-to-digital subconverter that may be used in connection with the analog-to-digital converter depicted in FIG. 2, in accordance with certain embodiments of the present disclosure.

DETAILED DESCRIPTION OF THE DISCLOSURE

Embodiments of the present disclosure and its advantages are best understood by referring to FIGS. 1 through 3 of the drawings, like numerals being used for like and corresponding parts of the various drawings.

FIG. 1 is a block diagram illustrating an image capture device 100 that may be used to capture images. For example, device 100 may be a digital camera, video camera, or any other suitable photographic and/or image capturing device. Image capture device 100 may include image sensor 120 and image processing unit 140. Image sensor 120 may be an active pixel sensor (APS) or any other suitable light sensing device that can capture images. Image sensor 120 may include, for example, a diode, a charge-coupled device (CCD), or any other photovoltaic detector or transducer. Image processing unit 140 may be a combination of hardware, software, or firmware that is operable to receive signal information from image sensor 120 and convert the signal information into an electronic image. For example, image processing unit 140 may include an analog-to-digital converter (ADC) to convert analog signals received by image sensor 120 to corresponding digital signals that may be further processed by image processing unit 140 and/or another processing device.

Image sensor 120 may include an array of unit cells 160. Unit cells 160 may accumulate charge proportional to the light intensity at the location of a coupled detector and may correspond to a pixel in the captured electronic image. Unit cell 160 may temporarily store the accumulated charge for use by processing unit 140 to create an image.

FIG. 2 depicts a block diagram illustrating an example pipelined analog-to-digital converter (ADC) 200 that may be used to convert analog signals (e.g., current, voltage, or electric charge) into digital signals, in accordance with certain embodiments of the present disclosure. While ADC 200 may be used for any suitable application, in certain embodiments, ADC 200 may be used in an imaging system (e.g., image capture device 100) in order to convert analog signals representing an image into corresponding digital signals. In the same or alternative embodiments, ADC 200 may be an integral part of an image processing unit (e.g., image processing unit 140) or similar image processing device.

As shown in FIG. 2, ADC 200 may include one or more analog-to-digital subconverters (ADSCs) 202, one or more multiplying digital-to-analog converters (MDACs) 204, and one or more sample-and-hold circuits 214. In certain embodiments, some or all of the components of ADC 200 may form a single integrated circuit including such components. Each ADSC 202 may include any system, device, or apparatus configured to convert an analog signal to a discrete digital number of a particular bit length. In certain embodiments, one or more of ADSCs 202 may be a single-slope ADC, such as that depicted in FIG. 3, for example.

Each MDAC 204 may include any system, device, or apparatus configured to convert a digital signal into a first analog signal, subtract the first analog signal from a second analog signal, and amplify the resulting difference between the second analog signal and the first analog signal. As shown in FIG. 2, each MDAC 204 may include a digital-to-analog converter (DAC) 208, a summer 210, a gain amplifier 212, and a sample-and-hold (S/H) circuit 214.

Each DAC 208 may be any suitable device, system, or apparatus configured to convert a digital number to an analog signal (e.g., current, voltage or electric charge).

Each summer 210 may be any suitable device, system, or apparatus configured to receive two or more analog signals (e.g., current, voltage, or electric charge) and output another analog signal representative of the sum and/or difference of the input signals. In certain embodiments, one or more of summers 210 may include a summing amplifier.

Each gain amplifier 212 may be any suitable device, system, or apparatus configured to receive an input signal (e.g., current or voltage) and amplify the input signal by a gain to produce an output signal that is a multiple of the input signal. In certain embodiments, one or more of gain amplifiers 212 may include a non-inverting amplifier, an inverting amplifier, or any combination thereof.

Each S/H circuit 214 may be any suitable device, system, or apparatus configured to receive a continuous analog signal (e.g., a time-varying current or voltage) and hold the analog signal steady for a specified period of time to allow an ADC or other following system to perform an operation on the held analog signal. In certain embodiments, S/H circuit 214 may include a capacitor to store an analog voltage, and may also include an electronic switch or gate to alternately connect and disconnect the capacitor from the analog input to be sampled and held.

In certain embodiments, DAC 208, summer 210, gain amplifier 212, and S/H circuit 214 of each MDAC 204 may be implemented in a single circuit, such as a solid state switched-capacitor circuit or a complimentary metal-on-silicon (CMOS) DAC, for example.

In operation, ADC 200 may convert an analog input signal received at an input of S/H 214a into a digital output representative of the analog input signal over a number of pipeline stages. To illustrate, in Stage 1 of ADC 200, an analog input signal may be sampled and held by S/H 214a. The held analog signal may be output to MDAC 204b of Stage 2, to be used as described in greater detail below. The held analog signal may be output to ADSC 202a, in which the most significant bits of the digital signal corresponding to the analog input signal may be computed. For example, if ASDC 202a has a resolution of four bits, the four most significant bits of the digital signal corresponding to the analog input signal may be computed and output by ASDC 202a. The digital signal corresponding to the most significant bits may then be output to MDAC 204b of Stage 2.

At Stage 2, DAC 208b of MDAC 204b may convert the output of ADSC 202a (the most significant bits of the digital output signal of ADC 200) to an analog signal, producing an idealized signal that is an approximation of the analog input signal to Stage 1. Summer 210b may subtract this idealized signal from the actual sampled-and-held analog signal from Stage 1, producing a residue analog signal equal to the difference between the actual analog signal and the idealized signal, such that the residue analog signal is less than the analog signal representation of one quantization level of ADSC 202a of Stage 1. Gain amplifier 212b may amplify the residual analog signal, and the amplified residual analog signal may be output to each of Stage 3 and ADSC 202b of Stage 2.

ADSC 202b may convert the Stage 2 amplified residual analog signal to a digital signal representative of the second most significant bits of the digital signal corresponding to the original analog input signal. For example, if each ADSC has a resolution of four bits, the combined output of ADSC 202a and ADSC 202b may represent the eight most significant bits of the digital signal corresponding to the original analog input signal. The digital signal output by ADSC 202b may be output to Stage 3.

Much like Stage 2, each additional stage of ADC 200 may compute a residual analog signal equal to the residual analog signal of the previous stage minus an idealized analog signal based on the digital output of the previous stage. Such residual analog signal may then be amplified, sampled and held, output to the next stage of ADC 200, and used such that the next most significant bits of the digital output signal of ADC 200 may be computed based on the amplified residual analog signal. Such process may be repeated for each of N stages, until finally Stage N produces the least significant bits of the digital output signal of ADC 200. Accordingly, the resolution (R) of ADC 200 is a function of the number of stages (N) and the resolution of each ADSC 202a (r) (e.g., R=N×r).

FIG. 3 depicts a block diagram illustrating an example sloping ADSC 300, in accordance with certain embodiments of the present disclosure. In certain embodiments, one or more of ADSCs 202 may include ADSC 300. As shown in FIG. 3, ADSC 300 may include an analog input 302, an analog ramp 304, a comparator 306, a digital counter 308, and a digital output 310. Analog input 302 may include any interface configured to receive an analog signal (e.g., voltage or current). Similarly, digital output 310 may include any interface configured to communicate a digital signal.

Analog ramp 304 may include any device, system or apparatus that provides an increasing or decreasing magnitude of analog signal during the sampling of each analog input. For example, analog ramp 304 may, during each sampling cycle of ADSC 300, linearly increase from approximately zero, up to a maximum magnitude.

Comparator 306 may include any device, system or apparatus that compares two analog signals (e.g., voltages or currents) at its inputs and switches its output between two values to indicate which is larger. For example, comparator may output a logic zero if the analog signal of analog input 302 is of a lower magnitude than the magnitude of the output of analog ramp 304, and may output a logic one otherwise. Accordingly, comparator 306 may be thought of as a one-bit ADC.

Digital counter 308 may include any device, system or apparatus that provides an increasing or decreasing magnitude of digital signal during the sampling of each analog input. For example, digital counter 308 may, during each sampling cycle of ADSC 300, count from approximately zero (e.g., 0000 in a four-bit counter), up to a maximum magnitude (e.g., 1111 in a four-bit counter). In some embodiments, digital counter 308 cease counting during a particular sampling cycle of ADSC 300 if it receives a particular value at its input (e.g., digital counter 308 may count if its input value is a logic zero, and may cease counting if its input value switches to a logic one).

In operation, when a new analog sample is placed on analog input 302, analog ramp 304 may begin to ramp (e.g., from zero) and digital counter 308 may begin to count (e.g., from zero). When the magnitude of the signal outputted by analog ramp 304 exceeds the magnitude of the signal on analog input 302, the output value of comparator 306 may flip (e.g., from logic zero to logic one, or vice versa) and digital counter 308 may cease counting. Accordingly, the value of digital counter when it ceases counting may be a digital representation of the magnitude of the signal on analog input 302.

As discussed above, sloping ADSCs identical or similar to the sloping ADSC 300 of FIG. 3 may be used as ADSCs 202 in ADC 200. The benefits of using a sloping ADSC in the architecture of ADC 200 is that sloping ASDCs require only a relatively small comparator and a relatively small digital counter within each stage of ADC in order to perform conversion. Another advantage is that a ramp circuit (e.g., analog ramp 304) may be shared among all ADSCs 202 in ADC 200 (and even amongst multiple ADCs). By pipelining into numerous stages each using a sloping ADSC, a desirable tradeoff between the size advantages and the speed disadvantages of sloping ADCs may be realized. For example, a 12-bit pipeline ADC including four three-bit sloping stages would ideally require $2^3=8$ clock cycles as compared to a non-pipelined 12-bit sloping ADC requiring $2^{12}=4096$ clock cycles. In addition, a plurality of sloping stages may consume less space and less power than traditional approaches to analog-to-digital conversion, such as flash or successive approximation approaches.

Although the embodiments in the disclosure have been described in detail, numerous changes, substitutions, variations, alterations, and modifications may be ascertained by those skilled in the art. For example, image sensor 120 may include any type of sensor including an APS, a separate detector, a separate detector material, or an alternate transducer other than an optical detector. Additionally or alternatively, while the disclosure is described predominantly in reference to visible detectors, the embodiments disclosed herein may be utilized with many types of detectors including, but not limited to, visible, infrared, ultraviolet, x-ray, or other radiation detectors. It is intended that the present disclosure encompass all such changes, substitutions, variations, alterations and modifications as falling within the spirit and scope of the appended claims.

What is claimed is:

1. A system for converting an analog signal to a digital signal, comprising:
    a plurality of converter stages, wherein at least one of the converter stages comprises:
        a multiplying digital-to-analog converter configured to:
            receive from a previous stage a first residue analog signal and a first idealized digital signal representing a first portion of the digital signal and corresponding to the first residue analog signal;
            convert the first idealized digital signal to an idealized analog signal; and
            output a second residue analog signal based on the difference between the first residue analog signal and the idealized analog signal; and
        an analog-to-digital subconverter configured to convert the second residue analog signal into a second idealized digital signal representing a second portion of the digital signal and corresponding to the second residue analog signal, the analog-to-digital subconverter comprising a sloping analog-to-digital converter.

2. A system according to claim 1, the multiplying digital-to-analog converter further configured to:
    amplify the difference between the first residue analog signal and the idealized analog signal;
    sample and hold the amplified difference; and
    output the sampled and held amplified difference as the second residue analog signal.

3. A system according to claim 1, the sloping analog-to-digital subconverter comprising a single-slope analog-to-digital converter.

4. A system according to claim 3, the sloping analog-to-digital subconverter comprising:
    an analog ramp configured to output a varying analog signal during a sampling cycle of the sloping analog-to-digital subconverter;
    a comparator configured to compare the varying analog signal to the second residue analog signal; and
    a digital counter configured to output a varying digital signal during the sampling cycle and to cease varying the digital counter based on the comparison made by the comparator, wherein:
    the value of the digital counter at the time the digital counter ceases varying is the second idealized signal.

5. A system according to claim 1, wherein the first residue analog signal is a voltage, current, or electrical charge.

6. A system according to claim 1, wherein the second residue analog signal is a voltage, current, or electrical charge.

7. A system for image sensing comprising:
    a detector configured to generate an electric charge in proportion to a detected light intensity;
    a unit cell coupled to the detector and configured to receive the electric charge; and
    an image processing unit electrically coupled to the detector and configured to read an electrical analog signal of the unit cell corresponding to the detected light intensity and comprising an analog-to-digital converter configured to convert the electrical analog signal to a digital signal corresponding to the detected light intensity, the analog-to-digital converter including a plurality of converter stages, wherein at least one of the converter stages comprises:
        a multiplying digital-to-analog converter configured to:
            receive from a previous stage a first residue analog signal and a first idealized digital signal representing a first portion of the digital signal and corresponding to the first residue analog signal;
            convert the first idealized digital signal to an idealized analog signal; and
            output a second residue analog signal based on the difference between the first residue analog signal and the idealized analog signal; and
        an analog-to-digital subconverter configured to convert the second residue analog signal into a second idealized digital signal representing a second portion of the digital signal and corresponding to the second residue analog signal, the analog-to-digital subconverter comprising a sloping analog-to-digital converter.

8. A system according to claim 7, the multiplying digital-to-analog converter further configured to:
    amplify the difference between the first residue analog signal and the idealized analog signal;
    sample and hold the amplified difference; and
    output the sampled and held amplified difference as the second residue analog signal.

9. A system according to claim 7, the sloping analog-to-digital subconverter comprising a single-slope analog-to-digital converter.

10. A system according to claim 9, the sloping analog-to-digital subconverter comprising:
    a comparator configured to compare a varying analog signal to the second residue analog signal; and a digital counter configured to output a varying digital signal during the sampling cycle and to cease varying the digital counter based on the comparison made by the comparator, wherein:
the value of the digital counter at the time the digital counter ceases varying is the second idealized signal.

11. A system according to claim 7, wherein the first residue analog signal is a voltage, current, or electrical charge.

12. A system according to claim 7, wherein the second residue analog signal is a voltage, current, or electrical charge.

13. A system according to claim 7, wherein the electrical analog signal is a voltage, current, or electrical charge.

14. A method for converting an analog electrical signal to a digital signal comprising:
sampling the electrical analog signal;
converting with a first sloping analog-to-digital subconverter the electrical analog signal to a first idealized digital signal of a first bit length, the first idealized digital signal corresponding to the first-bit-length-most significant bits of the digital signal;
converting the first idealized digital signal to a first idealized analog signal;
sampling a first residue analog signal based on the difference between the electrical analog signal and the first idealized analog signal; and
converting with a second sloping analog-to-digital subconverter the first residue analog signal to a second idealized digital signal of a second bit length, the second idealized digital signal corresponding to the second-bit-length-most significant bits of the digital signal remaining after the first-bit-length most significant bits of the digital signal.

15. A method according to claim 14, comprising:
converting the second idealized digital signal to a second idealized analog signal;
sampling a second residue analog signal based on the difference between the first residue analog signal and the second idealized analog signal; and
converting with a third sloping analog-to-digital subconverter the second residue analog signal to a third idealized digital signal of a third bit length, the third idealized digital signal corresponding to the third-bit-length-most significant bits of the digital signal remaining after the first-bit-length most significant bits of the digital signal and the second-bit-length most significant bits of the digital signal.

16. A method according to claim 15, wherein the first bit length, second bit length, and third bit length are equal.

17. A method according to claim 14, wherein the first bit length and second bit length are equal.

18. A method according to claim 14, wherein the first sloping analog-to-digital subconverter is substantially identical to the second sloping analog-to-digital subconverter.

19. A method according to claim 14, wherein the first residue analog signal is a voltage, current, or electrical charge.

20. A method according to claim 14, wherein the second residue analog signal is a voltage, current, or electrical charge.

21. A method according to claim 14, wherein the electrical analog signal is a voltage, current, or electrical charge.

* * * * *